United States Patent
Verhelijden et al.

(10) Patent No.: US 8,481,365 B2
(45) Date of Patent: Jul. 9, 2013

(54) MEMS DEVICES

(75) Inventors: Greja J. A. M. Verhelijden, Riethoven (NL); Philippe Meunier-Beillard, Kortenberg (BE); Johannes J. T. M. Donkers, Kortenberg (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/995,100

(22) PCT Filed: May 19, 2009

(86) PCT No.: PCT/IB2009/052086
§ 371 (c)(1),
(2), (4) Date: May 2, 2011

(87) PCT Pub. No.: WO2009/144619
PCT Pub. Date: Dec. 3, 2009

(65) Prior Publication Data
US 2011/0198746 A1 Aug. 18, 2011

(30) Foreign Application Priority Data
May 28, 2008 (EP) ..................................... 08104144

(51) Int. Cl.
*H01L 21/00* (2006.01)
*H01L 23/06* (2006.01)

(52) U.S. Cl.
USPC .... 438/106; 257/729; 257/414; 257/E29.002; 257/E21.499

(58) Field of Classification Search
USPC .................. 257/729, E21.499, E29.002, 419, 257/414, E29.166, E21.002, 415; 438/106, 438/53, 48, 50, 55
See application file for complete search history.

(56) References Cited

U.S. PATENT DOCUMENTS

| 5,188,983 | A | 2/1993 | Guckel et al. |
| 5,531,121 | A | 7/1996 | Sparks et al. |
| 6,010,927 | A * | 1/2000 | Jones et al. ................... 438/210 |
| 6,478,974 | B1 * | 11/2002 | Lebouitz et al. ................... 216/2 |
| 7,365,399 | B2 | 4/2008 | De Souza et al. |
| 7,659,150 | B1 * | 2/2010 | Monadgemi et al. ......... 438/125 |
| 2005/0179099 | A1 | 8/2005 | Lutz et al. |
| 2007/0045121 | A1 | 3/2007 | Cohen et al. |
| 2007/0235501 | A1 | 10/2007 | Heck |
| 2010/0052081 | A1 * | 3/2010 | Donkers et al. ............... 257/415 |
| 2010/0127339 | A1 * | 5/2010 | Laermer et al. ............... 257/415 |

FOREIGN PATENT DOCUMENTS

| CN | 101005052 A | 7/2007 |
| WO | 2009/130681 A2 | 10/2009 |

OTHER PUBLICATIONS

Mizushima, I., et al. "Empty-Space-in-Silicon Technique for Fabricating a Silicon-on-Nothing Structure", Applied Physics Letters, vol. 77, No. 20, pp. 3290-3292 (Nov. 13, 2000).

Hsu, W-T. "Low Cost Packages for MEMS Oscillators," IEEE Int'l. Electronics Manufacturing Technology Symposium, 5 pgs. (2007).

International Search Report and Written Opinion for In'tl. Patent Appln. No. PCT/IB2009/052086 (Jul. 27, 2010).

* cited by examiner

Primary Examiner — Jasmine Clark

(57) ABSTRACT

A method of manufacturing a MEMS device comprises forming a MEMS device element (14). A sacrificial layer (20) is provided over the device element and a package cover layer (22) is provided over the sacrificial layer. The sacrificial layer is removed using at least one opening (22) in the cover layer and the at least one opening (24) is sealed by an anneal process.

14 Claims, 4 Drawing Sheets

MEMS DEVICES

This invention relates to MEMS devices, and in particular to the formation of packaged devices.

MEMS technologies are increasingly being used in integrated circuits. However, numerous product concepts have not been implemented in practice as a result of difficulties providing suitable and cost effective packaging.

There are many contributing factors to the high costs in packaging of MEMS devices and systems. The three principal factors are:

proper packaging and efficient assembly of parts and components of sizes less than a few millimetres for MEMS system, with complex geometries, requires special tools and fixtures.

the high diversity of MEMS devices and systems makes requirements for reliable packaging vary significantly from one product to another. For example, vacuum packing for hermetic sealing is a necessity in many cases.

the small size of parts and components in MEMS devices and systems creates many unique problems in both packaging and assembly.

There are a number of techniques used for encapsulating MEMS devices:

use of off-the-shelf packages and careful handling techniques;

attachment of a separate cap, usually glass or silicon, on top of a finished MEMS device part;

integrated wafer level encapsulation.

The selection of off-the-shelf components is a costly and time-consuming process.

The use of a separate cap requires a capping wafer, which typically comprises a pre-fabricated cavity formed of glass or silicon. Anodic of frit glass bonding is then used, because of the back-end compatible process temperatures (400° C.) in preference to fusion bonding at much higher temperatures (1000° C.). A vacuum inside the cavity can be achieved if the bonding is performed in a vacuum chamber. This approach requires wafer bonding and flip-chip alignment equipment.

An integrated wafer-level solution involves fabricating caps using standard surface micro machining techniques. This approach consumes less area and the chip height is kept lower than if an independently manufactured cap is used. Another advantage of an integrated approach is that the MEMS structure is protected during chip dicing and handling for contamination. If the encapsulation is strong enough, the MEMS chip can be further packaged like a normal IC, which is cost effective. Furthermore this allows the possibility of integration with CMOS processes.

This invention relates to an integrated approach for forming MEMS device packaging.

According to the invention, there is provided a method of manufacturing a MEMS device, comprising:

forming a MEMS device element;

forming a sacrificial layer over the device element;

forming a package cover layer over the sacrificial layer;

defining at least one opening in the package cover layer;

removing the sacrificial layer through the at least one opening, thereby forming a package space over the device element; and sealing the at least one opening by a hydrogen anneal process.

This method provides a way of forming a closed cavity over a MEMS device element, using standard fabrication processes. A low number of steps is required—in particular with an anneal process (i.e. heating) in order to cause the at least one opening to close.

The sacrificial layer can comprise an oxide layer, for example silicon oxide. This can be removed by a standard HF wet etch process or with HF vapour etching.

The package cover layer preferably comprises silicon, for example polycrystalline silicon or silicon-germanium (SiGe). The hydrogen anneal process closes the at least one opening due to migration of the silicon atoms, but without leaving impurities inside the cavity.

The package cover layer can have a thickness of between 500 nm and 10 µm. The diameter of the at least one opening can be selected depending on the number of openings, and may be of the same order of magnitude as the package cover layer thickness.

Another layer, that can be silicon nitride, can be provided beneath the package cover layer, through which the at least one opening is also formed. This layer is preferably not affected by the anneal process, so that the top surface of the cavity remains smooth and not physically altered by the anneal process.

The method can further comprise providing an anneal protection layer as part of the process of forming the MEMS device element. This protects the MEMS device (for example a resonator mass, or a flexible contact beam, or a movable capacitor electrode) with a protective layer to prevent damage by the anneal process. The protection layer can comprise silicon nitride.

The invention also provides a packaged MEMS device, comprising:

a MEMS device element;

a package cover layer, provided over a cavity above the MEMS device element; and a sealed sacrificial-etch opening in the package cover layer, wherein the device further comprises a silicon nitride layer beneath the package cover layer, having at least one opening aligned with the sealed sacrificial-etch opening.

Examples of the invention will now be described with reference to the accompanying drawings, in which.

The invention provides a method of manufacturing a MEMS device in which a closed cavity is formed over the MEMS device element. A sacrificial layer is used, which is removed through holes in a cover layer. The holes are then sealed by an anneal process.

Figure 1:
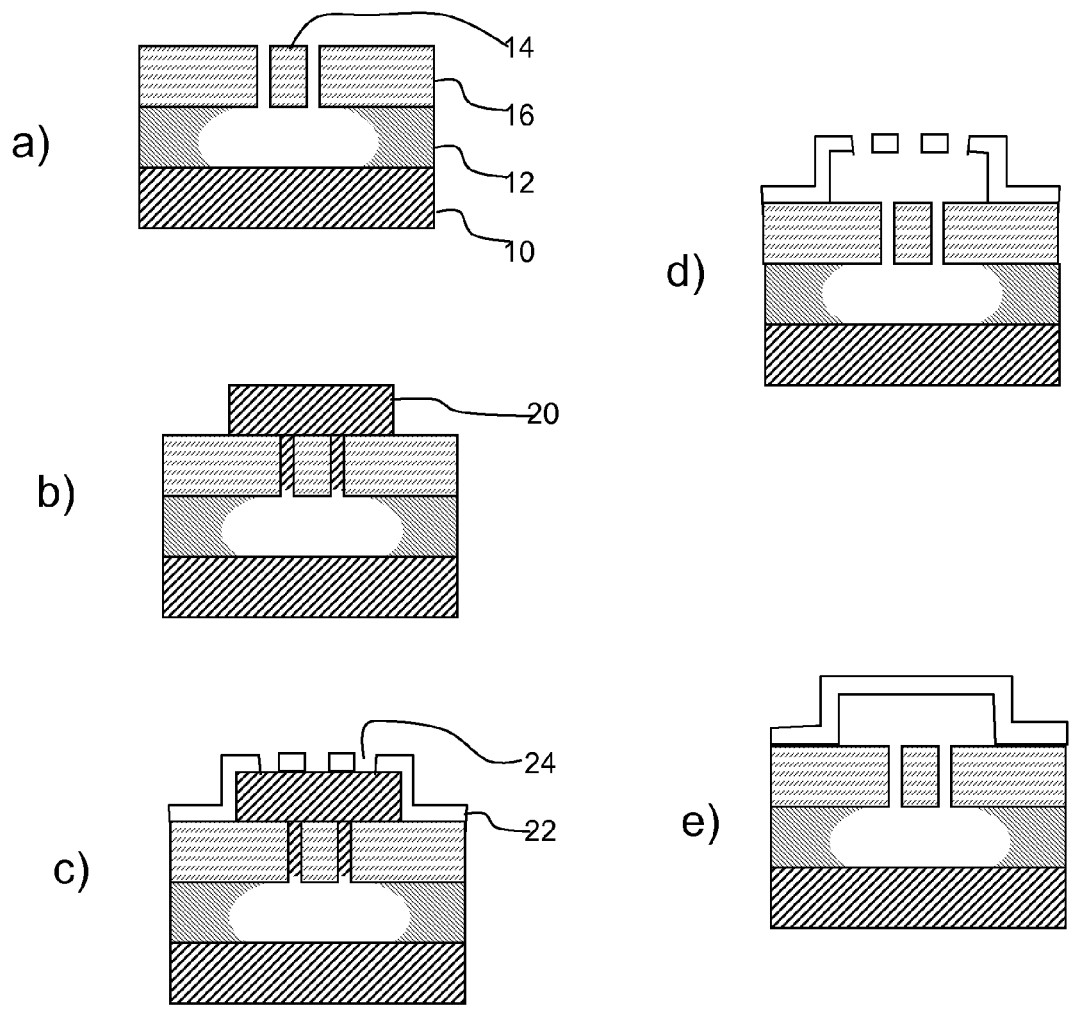
FIG. 1a-1e show an example of the manufacturing process in accordance with the invention.

FIG. 1 shows schematically the method of the invention.

FIG. 1a shows a completed surface-micro machined device, in the form of a resonator in this example. The device comprises a silicon substrate 10, a silicon oxide layer 12 which forms a cavity beneath the resonator mass, and the resonator mass 14 formed in a silicon layer 16.

The manufacture of the MEMS device does not need to be altered by this invention, and any conventional techniques can be used. The MEMS device can be a resonator, capacitor or switch, for example. Typically, the device has a movable portion which needs to be carefully protected by the packaging—in this example the device has a suspended resonator mass 14.

A sacrificial layer 20 is deposited and patterned to form an island over the MEMS device, as shown in FIG. 1b.

A packaging cap layer 22 of poly-silicon is deposited for the formation of the encapsulation shell, and release holes 24 are patterned as shown in FIG. 1c.

Removal of the sacrificial layer 20, through the release holes 24, is provided, to release the mechanical micro structures as shown in FIG. 1d. The etching release holes are then sealed by a $H_2$ anneal, to give the structure shown in FIG. 1e.

The hydrogen anneal process aims to create a clean silicon (or polysilicon or silicon-germanium) surface. The hydrogen gas does not react with silicon and is proven to desorb efficiently any remaining $SiO_2$. The silicon atoms present on a clean silicon surface can move and have an increasing mobility with higher temperature and lower pressure. Typical conditions for the hydrogen anneal are:

temperature between 800 and 1150 degrees Celsius (depending on the melting point of the material); and low pressure, typically ranging from mTorr to atmospheric pressure.

The hydrogen gas can be diluted in He or Ar, and preferably has good purity.

The surface of the capping layer can be cleaned with an HF solution before the anneal process, and ideally the time between the cleaning process and the anneal process should be as short as possible.

An advantage of the invention is that the release holes 24 are closed without leaving impurities inside the cavity. This allows the design of the positioning of the release holes 24 in such a way that the release is optimal (faster), moreover the release holes can be designed above the resonator which enables a smaller package. Furthermore, it has been found by experimentation that it is possible to seal release holes with a diameter size of 1 μm with a capping layer 22 which is only 1 μm thick. This means that there is a relatively short and wide passageway for the sacrificial etchants, which also will result in a short release time.

The use of a silicon-containing layer means than an $H_2$ anneal will close the release holes due to migration of the silicon atoms but will not leave impurities inside the cavity.

The operation of the invention has been demonstrated by experiment.

In a first experiment, release holes in a 1 μm polysilicon cap layer were sealed.

Figure 2:
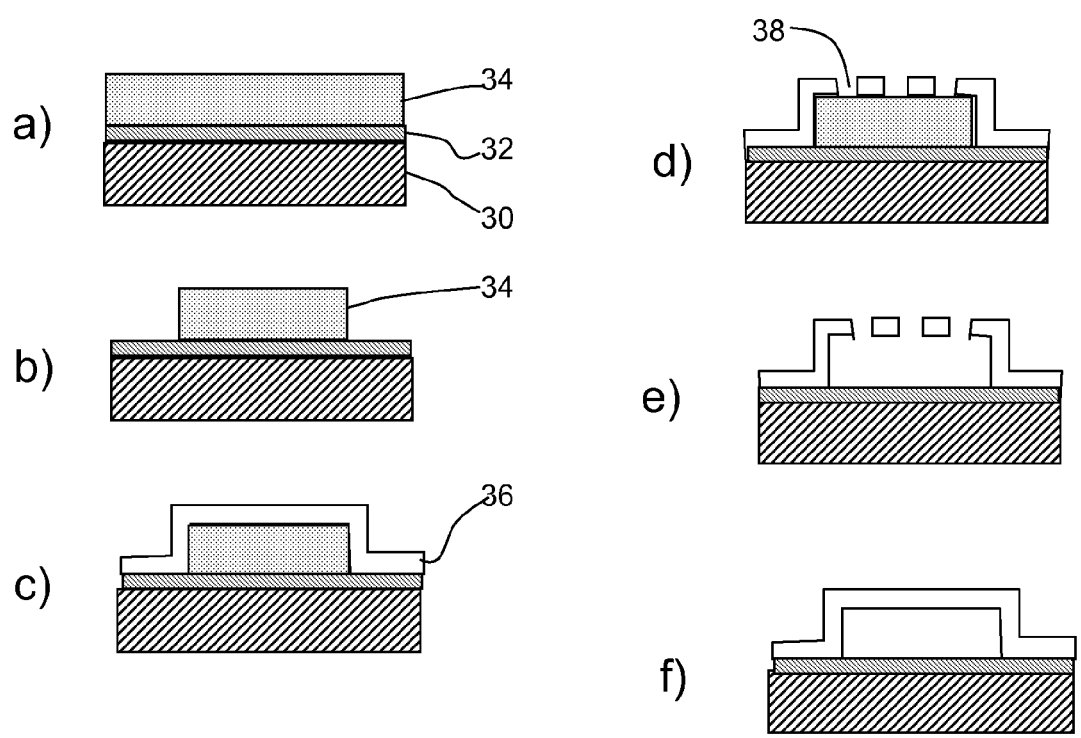
FIGS. 2a-2f are used to explain a first experiment used to demonstrate the viability of the invention.

FIG. 2 is a schematic drawing of the experiment.

On a silicon substrate 30, a silicon nitride layer 32 and a silicon oxide layer 34 are deposited (FIG. 2a). The oxide (sacrificial) layer 34 is patterned (FIG. 2b) and a 1 μm thick silicon cap layer 36 is deposited (FIG. 2c)

Patterning of the release holes 38 in the cap layer is provided (FIG. 2d), and the sacrificial oxide layer is then removed with an HF-solution or HF-vapor etching (FIG. 2e). The release holes were sealed with a Hydrogen anneal for 2 min at 1100° C. and a pressure of 20 Torr, to provide the structure shown in FIG. 2f.

Analysis of the results, using cross-section SEM images, shows that the cavities which had original release holes of 500 nm and 1000 nm diameter are completely sealed. If 1500 nm diameter release holes are used, the sealing was found to be incomplete, although the size of the release holes decreased. 1000 nm diameter release holes are more than adequate to function as release holes for the MEMS devices using a wet etch process.

A second experiment provided a decrease of the sealing temperature to 1050° C., to show the temperature dependence of the sealing. In this case, the 500 nm release holes are still sealed, but the 1000 nm release holes are decreased in size but not sealed.

The capping layer can become rough due to the anneal sealing process. This can increase the height needed inside the cavity for moving of the MEMS device.

Figure 3:
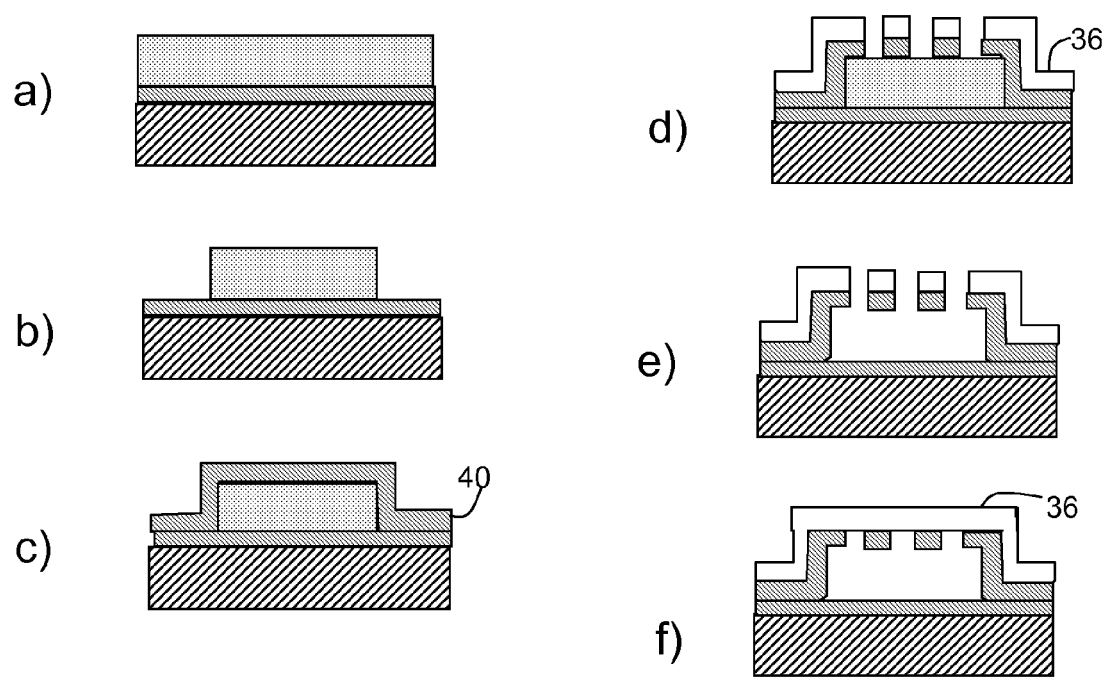
FIGS. 3a-3f are used to explain a second experiment used to demonstrate the viability of a second example of method of the invention.

FIG. 3 is used to explain an approach in which a nitride layer (50 nm thick for example) is deposited underneath the polysilicon cap layer 36.

FIGS. 3a and 3b correspond to FIGS. 2a and 2b.

In FIG. 3c, the 50 nm thick nitride layer 40 is deposited, followed by the 1 μm thick silicon as cap layer 36 as in the example of FIG. 2.

The release holes are patterning into the cap layer 36 and the silicon nitride protective layer 40. The sacrificial oxide layer is again removed with an HF-solution (FIG. 3e).

The release holes are then sealed with the hydrogen anneal, for example again 2 min at 1100° C. and a pressure of 20 Torr.

The release holes are again sealed in the cap layer, but not in the silicon nitride layer. The silicon nitride layer is not affected, and as a result, the ceiling of the cavity has been shown by experiment to be much smoother than the cavities when no silicon nitride layer is used.

Because most resonators are made of silicon, the hydrogen anneal can also change the shape of the resonator and so can influence the performance of the resonator.

One way to address this issue is to provide a protective layer for the resonator parts.

A further experiment to demonstrate this concept is explained with reference to FIG. 4.

Figure 4:
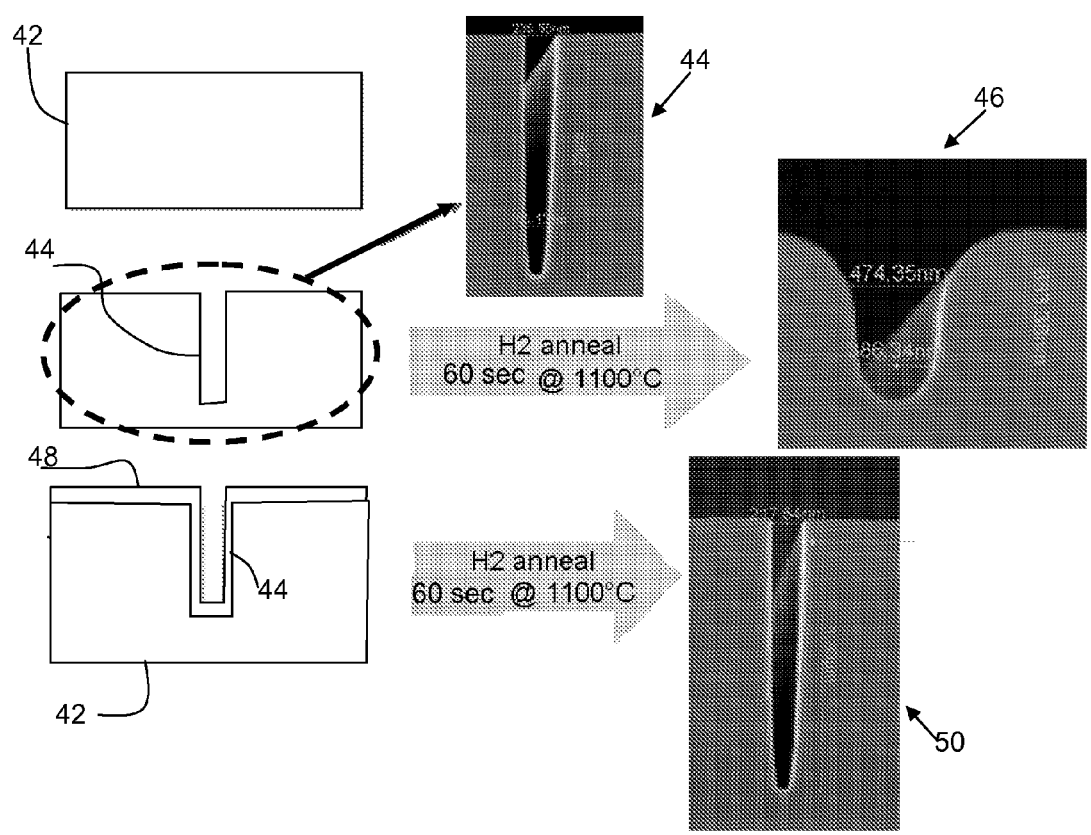
FIG. 4 is used to explain a third experiment used to demonstrate the viability of a third example of method of the invention.

FIG. 4 shows a silicon layer 42 into which a 200 nm wide isolated trench 44 is etched, which simulates a small gap of a resonator. The wafer is again cured with a hydrogen anneal at 1100° C. and 20 Torr for 2 minutes.

An SEM image of the trench is shown as SEM image 44, and the resulting profile after the anneal is shown as image 46.

On another wafer, the trench is first covered with a 5 nm thick nitride (protection) layer 48 before it is subjected to the same hydrogen anneal. This can be applied by a LPCVD (low pressure chemical vapour deposition) process. The resulting profile after the anneal is shown as image 50.

The image 46 shows that the shape of the trench without the nitride protection layer is changed from its original. The trench which is protected by a thin nitride layer before anneal maintains its original shape.

The experiments described above show that it is possible to seal release holes up to 1 μm. Larger release holes can be sealed if higher temperatures, longer annealing times or thicker capping layers are used. Due to the high process temperatures, the integration of the MEMS device with CMOS processing is limited. The MEMS device has to be encapsulated before the CMOS processing.

Also, the high temperatures limit the choice of materials which can be used as device material for the MEMS device. However, most resonators are made of silicon which can withstand the high temperatures used for the hydrogen anneal, particularly if they are protected by for instance by a thin nitride layer as explained above.

The annealing temperature can be reduced by using SiGe or Ge as a capping layer instead of poly-silicon. In this way the reflow temperature can be lowered to such a level that the SiGe or Ge reflows, but the mono-crystalline Si resonator still remains intact.

One main application of the invention is MEMS resonators. These resonators can be used to substitute crystal oscillators for timing reference purposes.

Various other applications like gyroscopes and accelerometers will be apparent to those skilled in the art.

The invention claimed is:

1. A method of manufacturing a MEMS device, comprising:
    forming a MEMS device element;
    forming a sacrificial layer over the device element;
    forming a package cover layer over the sacrificial layer;
    defining at least one opening in the package cover layer;
    removing the sacrificial layer through the at least one opening, thereby forming a package space over the device element; and
    sealing the at least one opening by a hydrogen anneal process.

2. A method as claimed in claim 1, wherein the sacrificial layer comprises an oxide layer.

3. A method as claimed in claim 2, wherein the sacrificial layer comprises silicon oxide.

4. A method as claimed in claim 1, wherein the package cover layer comprises silicon.

5. A method as claimed in claim 4, wherein the package cover layer comprises polycrystalline silicon-germanium.

6. A method as claimed in claim 4, wherein the package cover layer comprises polycrystalline silicon.

7. A method as claimed in claim 1, wherein removing the sacrificial layer comprises at least one of a HF wet etch process and a HF-vapor process.

8. A method as claimed in claim 1, further comprising providing a silicon nitride layer beneath the package cover layer, through which at least one opening is also formed.

9. A method as claimed in claim 1, further comprising providing an anneal protection layer as part of the process of forming the MEMS device element.

10. A method as claimed in claim 9, wherein the protection layer comprises silicon nitride.

11. A method as claimed in claim 1, wherein the MEMS device element comprises at least one of a switch, a capacitor and a resonator.

12. A packaged MEMS device, comprising:
    a MEMS device element;
    a package cover layer, provided over a cavity above the MEMS device element;
    a hydrogen annealed sealed sacrificial-etch opening in the package cover layer; and
    a silicon nitride layer beneath the package cover layer, having at least one opening aligned with the sealed sacrificial-etch opening.

13. A device as claimed in claim 12, wherein the package cover layer comprises at least one of polycrystalline silicon, polycrystalline silicon-germanium and germanium.

14. A device as claimed in claim 13, wherein the hydrogen annealed sealed sacrificial-etch opening includes silicon atoms migrated due to an $H_2$ anneal.

* * * * *